United States Patent
Wang et al.

(10) Patent No.: US 10,498,309 B2
(45) Date of Patent: Dec. 3, 2019

(54) COMMON MODE INDUCTOR APPARATUS HAVING COIL WINDING WOUND IN MULTIPLE WINDING AREAS, AND RELATED WINDING METHOD OF COMMON MODE INDUCTOR APPARATUS AND ELECTROMAGNETIC INTERFERENCE FILTER CIRCUIT

(71) Applicant: 3Y POWER TECHNOLOGY (TAIWAN), INC., Taoyuan (TW)

(72) Inventors: Chuan-Kai Wang, Taoyuan (TW); Chung-Yu Lan, Taoyuan (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 16 days.

(21) Appl. No.: 15/839,863

(22) Filed: Dec. 13, 2017

(65) Prior Publication Data

US 2018/0183401 A1    Jun. 28, 2018

Related U.S. Application Data

(60) Provisional application No. 62/437,683, filed on Dec. 22, 2016.

(51) Int. Cl.
| | |
|---|---|
| *H03H 7/42* | (2006.01) |
| *H03H 7/01* | (2006.01) |
| *H03H 7/09* | (2006.01) |
| *H01F 41/06* | (2016.01) |
| *H01F 27/32* | (2006.01) |
| *H01F 27/24* | (2006.01) |

(52) U.S. Cl.
CPC .............. *H03H 7/427* (2013.01); *H01F 27/24* (2013.01); *H01F 27/32* (2013.01); *H01F 41/06* (2016.01); *H03H 7/0115* (2013.01); *H03H 7/09* (2013.01)

(58) Field of Classification Search
CPC ......... H03H 7/427; H03H 7/0115; H03H 7/09
USPC .................................................. 333/181, 185
See application file for complete search history.

(56) References Cited

U.S. PATENT DOCUMENTS

| | | | | |
|---|---|---|---|---|
| 4,910,482 A | * | 3/1990 | Takagai | .................. H01F 38/02 333/12 |
| 2002/0080001 A1 | * | 6/2002 | Kobayashi | ............ H01F 17/062 336/229 |

FOREIGN PATENT DOCUMENTS

TW           201546844 A        12/2015

OTHER PUBLICATIONS

English translation of JP2017183444; Oct. 5, 2017 (Year: 2017).*

* cited by examiner

*Primary Examiner* — Rakesh B Patel
(74) *Attorney, Agent, or Firm* — Winston Hsu

(57) ABSTRACT

A common mode inductor apparatus includes a magnetic core, a first coil winding and a second coil winding. The magnetic core has a first winding zone and a second winding zone. The first coil winding is wound in three winding areas within the first winding zone, wherein two neighboring winding areas within the first winding zone are separated by a gap. The second coil winding is wound in three winding areas within the second winding zone, wherein two neighboring winding areas within the second winding zone are separated by a gap.

16 Claims, 7 Drawing Sheets

COMMON MODE INDUCTOR APPARATUS HAVING COIL WINDING WOUND IN MULTIPLE WINDING AREAS, AND RELATED WINDING METHOD OF COMMON MODE INDUCTOR APPARATUS AND ELECTROMAGNETIC INTERFERENCE FILTER CIRCUIT

CROSS REFERENCE TO RELATED APPLICATIONS

This application claims the benefit of U.S. provisional application No. 62/437,683, filed on Dec. 22, 2016, the contents of which are incorporated herein by reference.

BACKGROUND OF THE INVENTION

1. Field of the Invention

The disclosed embodiments of the present invention relate to a common mode inductor, and more particularly, to a common mode inductor apparatus having a coil winding wound in multiple winding areas (e.g. three winding areas) of a magnetic core, a related winding method and a related electromagnetic interference filter circuit.

2. Description of the Prior Art

An electromagnetic interference (EMI) filter circuit is utilized in a power supply to suppress EMI noise generated by switching operation, wherein a common mode inductor is one of the main EMI suppression devices in the EMI filter circuit. As a result of the trend toward miniaturization and high-frequency operation of a power supply, it is necessary to employ a two-stage EMI filter circuit since a single-stage EMI filter is insufficient to suppress EMI noise generated by switching operation. As shown in FIG. 1, a conventional two-stage EMI filter circuit 102 includes two common mode inductors L11 and L21, and a plurality of capacitors C0, C11-C13 and C21-C23, wherein each of the capacitors C0, C11 and C21 is an X capacitor, and each of the capacitors C12, C13, C22 and C23 is a Y capacitor. However, as each circuit device occupies a portion of inner space of a power supply, the conventional two-stage circuit structure EMI filter circuit actually fails to meet miniaturization requirements.

Additionally, as shown in FIG. 2, a common mode inductor used in a conventional single-stage/two-stage EMI filter circuit (e.g. the common mode inductor L11/L21) is formed by symmetrically winding two coils 212 and 214 one a closed magnetic core 204. However, this common mode inductor possesses poor EMI suppression ability, leading to an increased dependence on other EMI suppression devices. For example, it is required to increase the number of capacitors or increase capacitance of a capacitor used in the single-stage/two-stage EMI filter circuit.

Thus, there is a need for a novel common mode inductor apparatus (or a novel EMI filter circuit) to meet miniaturization and high-frequency operation requirements of a power supply.

SUMMARY OF THE INVENTION

It is therefore one objective of the present invention to provide a common mode inductor apparatus having a coil winding wound in multiple winding areas (e.g. three winding areas) of a magnetic core, a related winding method and a related electromagnetic interference filter circuit to solve the above problems.

According to an embodiment of the present invention, an exemplary common mode inductor apparatus is disclosed. The exemplary common mode inductor apparatus comprises a magnetic core, a first coil winding and a second coil winding. The magnetic core has a first winding zone and a second winding zone. The first coil winding is wound in three winding areas within the first winding zone, wherein two neighboring winding areas within the first winding zone are separated by a gap. The second coil winding is wound in three winding areas within the second winding zone, wherein two neighboring winding areas within the second winding zone are separated by a gap.

According to an embodiment of the present invention, an exemplary method for winding a first coil winding and a second coil winding of a common mode inductor apparatus is disclosed. The exemplary method comprise the following steps: providing a magnetic core having a first winding zone and a second winding zone; winding the first coil winding in three winding areas within the first winding zone, wherein two neighboring winding areas within the first winding zone are separated by a gap; and winding the second coil winding in three winding areas within the second winding zone, wherein two neighboring winding areas within the second winding zone are separated by a gap.

According to an embodiment of the present invention, an exemplary electromagnetic interference filter circuit is disclosed. The exemplary electromagnetic interference filter circuit receives an input power to generate a power to be rectified. The exemplary electromagnetic interference filter circuit comprises a pair of input terminals, a pair of output terminals, a ground terminal, a first capacitor, a second capacitor, a third capacitor, a fourth capacitor and a common mode inductor apparatus. The pair of input terminals has a first input terminal and a second input terminal, and is arranged for receiving the input power. The pair of output terminals has a first output terminal and a second output terminal, and is arranged for outputting the power to be rectified. The first capacitor is coupled between the first input terminal and the second input terminal. The second capacitor is coupled to the first output terminal and the second output terminal. The third capacitor is coupled between the first output terminal and the ground terminal. The fourth capacitor is coupled between the ground terminal and the second output terminal. The common mode inductor apparatus is coupled to the pair of input terminals and the pair of output terminals, and comprises a magnetic core, a first coil winding and a second coil winding. The magnetic core has a first winding zone and a second winding zone. The first coil winding is coupled between the first input terminal and the first output terminal, wherein the first coil winding is wound in three winding areas within the first winding zone, and two neighboring winding areas within the first winding zone are separated by a gap. The second coil winding is coupled between the second input terminal and the second output terminal, wherein the second coil winding is wound in three winding areas within the second winding zone, and two neighboring winding areas within the second winding zone are separated by a gap.

The proposed common mode inductor apparatus, winding method of a common mode inductor apparatus, and electromagnetic interference (EMI) filter circuit may increase EMI suppression ability of a common mode inductor, and reduce space occupied by the EMI filter circuit, thereby meeting miniaturization and high-frequency operation requirements of a power supply.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

By winding a coil in winding areas of a magnetic core which are separated by two or more gaps, the proposed common mode inductor apparatus may include a coil winding having coil sections which are wound in multiple winding area (e.g. three or more winding areas) respectively, wherein a voltage drop across the coil winding may be equal to (or substantially equal to) a sum of respective voltage drops across the coil sections. As a voltage drop across a coil section is small compared with the voltage drop across the coil winding, the coil winding, formed by winding the coil sections in multiple winding areas, may have low parasitic capacitance. The proposed common mode inductor apparatus may therefore have both good high-frequency filtering ability and good low-frequency filtering ability. Further description is provided below.

Figure 1:
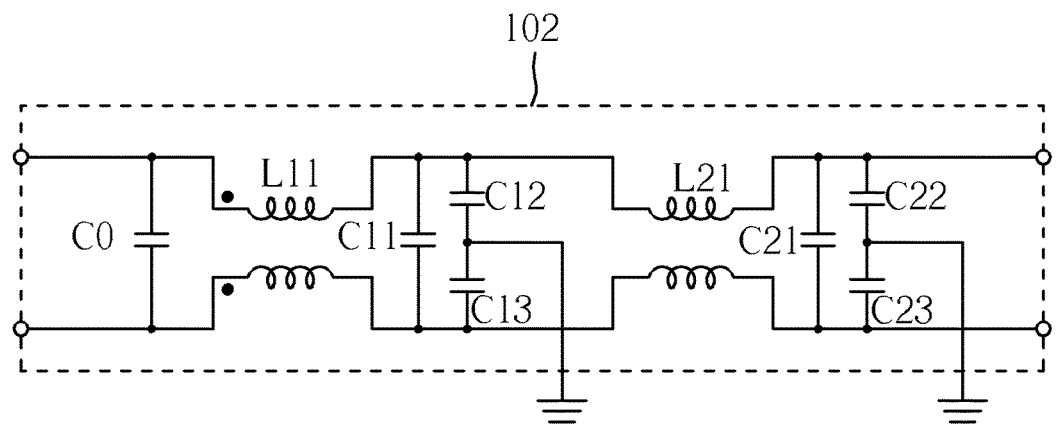
FIG. 1 illustrates a conventional two-stage EMI filter circuit.
Figure 2:
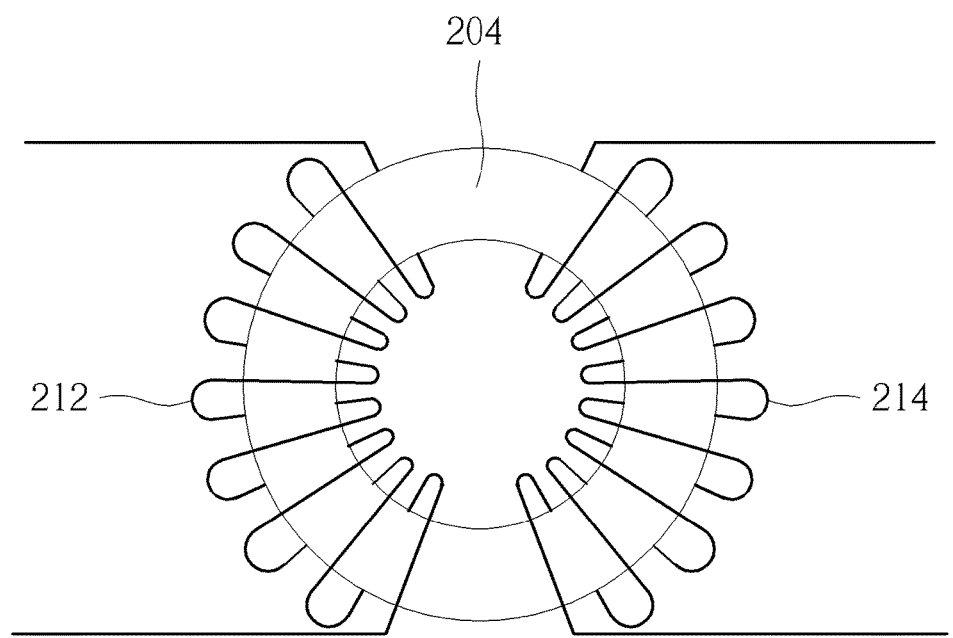
FIG. 2 illustrates a common mode inductor used in a conventional single-stage/two-stage EMI filter circuit.
Figure 3A:
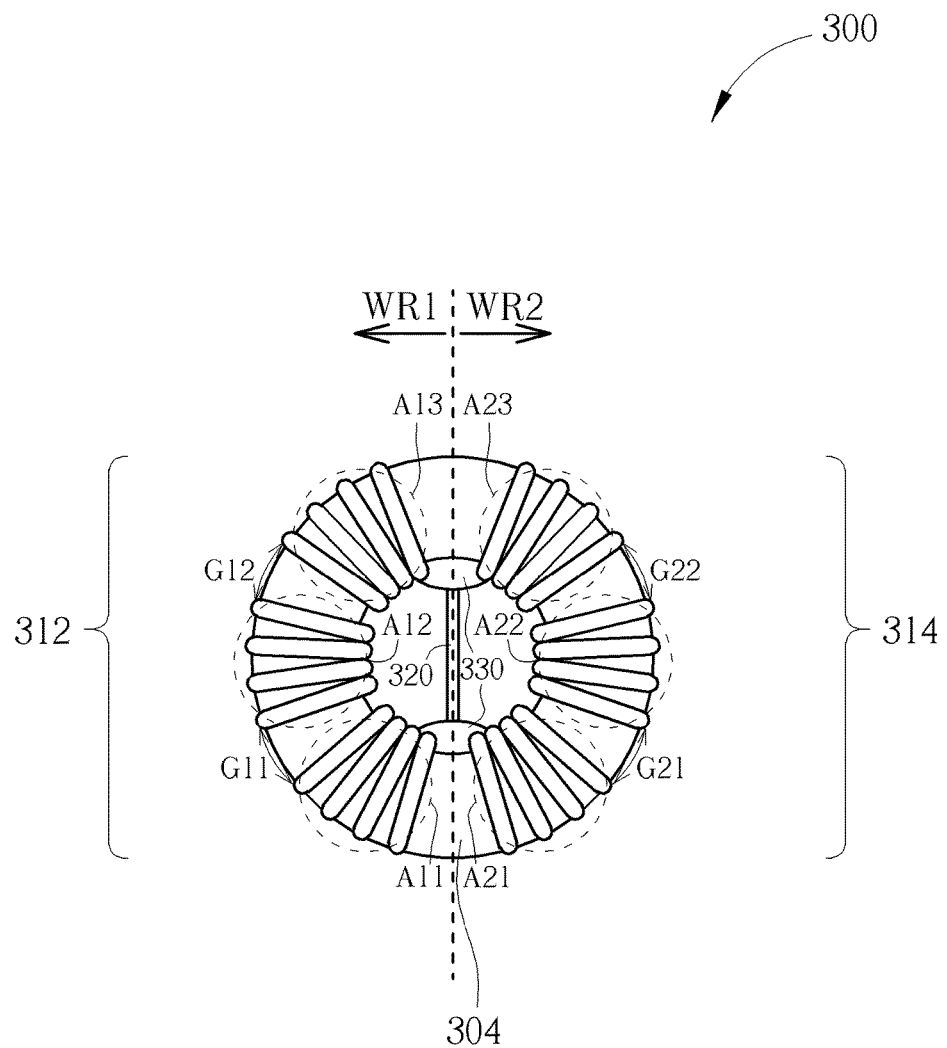
FIG. 3A is a diagram illustrating an exemplary common mode inductor apparatus according to an embodiment of the present invention.

FIG. 3A is a diagram illustrating an exemplary common mode inductor apparatus according to an embodiment of the present invention. The common mode inductor apparatus 300 may include, but is not limited to, a magnetic core 304, a coil winding 312 and a coil winding 314. The magnetic core 304 may have a winding zone WR1 and a winding zone WR2, wherein the coil winding 312 may be wound in three winding areas A11-A13 within the winding zone WR1, and the coil winding 314 may be wound in three winding areas A21-A23 within the winding zone WR2. It should be noted that two neighboring winding areas within the winding zone WR1 may be separated by a gap, and two neighboring winding areas within the winding zone WR2 may be separated by a gap. Specifically, the winding area A11 and the winding area A12 may be separated by a gap G11, the winding area A12 and the winding area A13 may be separated by a gap G12, the winding area A21 and the winding area A22 may be separated by a gap G21, and the winding area A22 and the winding area A23 may be separated by a gap G22. In other words, the coil winding 312 may be wound in the three winding areas A11-A13 to form three coil sections (the coil winding 312 may be divided into the three coil sections), and the coil winding 314 may be wound in the three winding areas A21-A23 to form three coil sections (the coil winding 314 may be divided into the three coil sections).

Figure 3B:
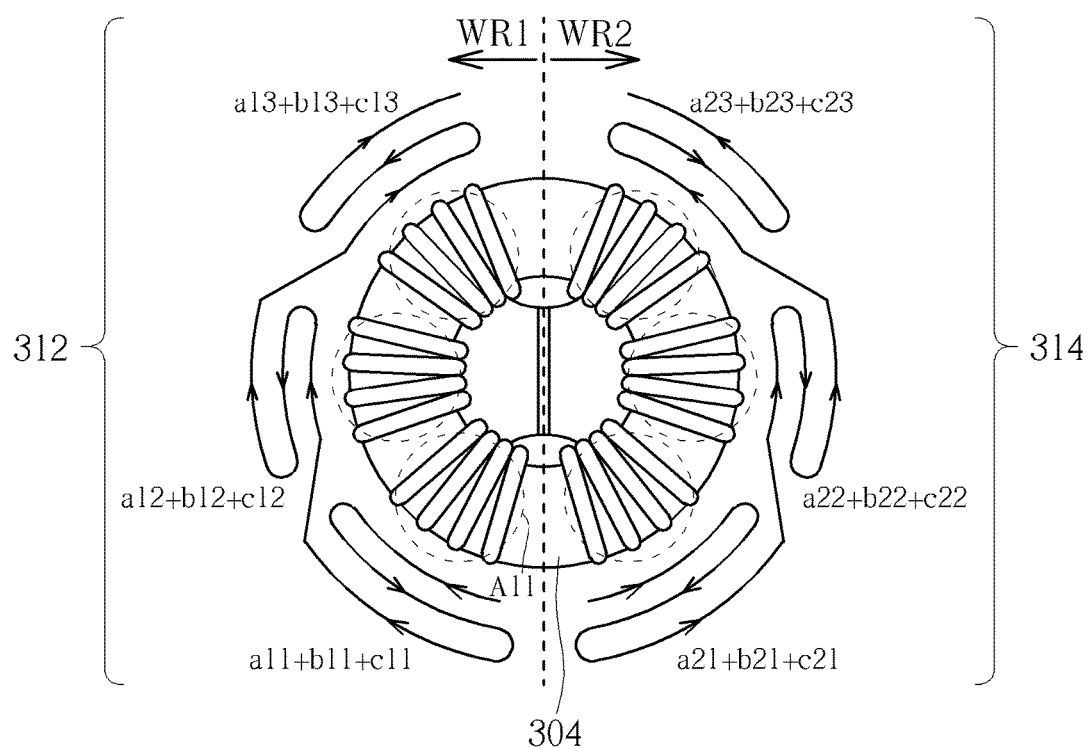
FIG. 3B is a diagram illustrating an exemplary winding method of the common mode inductor apparatus according to an embodiment of the present invention.

Please refer to FIG. 3B in conjunction with FIG. 3A. FIG. 3B is a diagram illustrating an exemplary winding method of the common mode inductor apparatus 300 according to an embodiment of the present invention. Regarding the coil winding 312, by way of example but not limitation, three coil layers may be wound in the winding area A11 firstly, wherein the respective numbers of turns of the first coil layer, the second coil layer and the third coil layer of the three coil layers are $a11$, $b11$ and $c11$, and $a11$, $b11$ and $c11$ are all greater than zero. In other words, the number of turns of a coil wound in the winding area A11 is $a11+b11+c11$. After the coil has been wound in the winding area A11, three coil layers may be wound in the winding area A12 to form a coil having the number of turns $a12+b12+c12$, wherein the respective numbers of turns of the three coil layers are $a12$, $b12$ and $c12$, each being greater than zero. In addition, after the coil has been wound in the winding area A12 is wound, three coil layers may be wound in the winding area A13 to form a coil having the number of turns $a13+b13+c13$, wherein the respective numbers of turns of the three coil layers are $a13$, $b13$ and $c13$, each being greater than zero.

Similar to the coil winding 312, regarding the coil winding 314, three coil layers may be wound in the winding area A21 firstly to form a coil having the number of turns $a21+b21+c21$, wherein the respective numbers of turns of the three coil layers are $a21$, $b21$ and $c21$, each being greater than zero. After that, three coil layers may be wound in the winding area A22 to form a coil having the number of turns $a22+b22+c22$, wherein the respective numbers of turns of the three coil layers are $a22$, $b22$ and $c22$, each being greater than zero. Next, three coil layers may be wound in the winding area A23 to form a coil having the number of turns $a23+b23+c23$, wherein the respective numbers of turns of the three coil layers are $a23$, $b23$ and $c23$, each being greater than zero.

In some embodiments, the coil winding 314 may be wound symmetrically in relation to the coil winding 312 in the winding zone WR2, or the coil winding 312 may be wound symmetrically in relation to the coil winding 314 in the winding zone WR1. By way of example but not limitation, the number of turns of the coil winding 312 (e.g. a11+b11+c11+a12+b12+c12+a13+b13+c13) may be equal to the number of turns of the coil winding 314 (e.g. a21+b21+c21+a22+b22+c22+a23+b23+c23).

In some embodiments, a coil section of the coil winding 314 wound in a winding area may be symmetrical to a coil section of the coil winding 312 wound in a winding area. By way of example but not limitation, the number of turns of the coil section wound in the winding area A21 may be identical to that of the coil section wound in the winding area A11, the number of turns of the coil section wound in the winding area A22 may be identical to that of the coil section wound in the winding area A12, and/or the number of turns of the coil section wound in the winding area A23 may be identical to that of the coil section wound in the winding area A13. Additionally, the respective numbers of turns of coil layers wound in a winding area corresponding to the coil winding 314 may be identical to the respective numbers of turns of coil layers wound in a winding area corresponding to the coil winding 312. For example, regarding the winding area A11 corresponding to the coil winding 312 and the winding area A21 corresponding to the coil winding 314, a11 may be identical to a21, b11 may be identical to b21, and c11 may be identical to c21.

In some embodiments, coil sections of a coil winding wound in respective winding areas may have the same number of turns. By way of example but not limitation, three coil sections of the coil winding 312 respectively wound in the winding areas A11-A13 may have the same number of turns, and three coil sections of the coil winding 314 respectively wound in the winding areas A21-A23 may have the same number of turns.

Please note that the winding method described above is for illustrative only, and is not meant to be a limitation of the present invention. In an alternative design, the number of winding areas corresponding to each coil winding may be greater than three. In other words, each coil winding may be wound in winding areas which are separated by three or more gaps, thus forming four or more coil sections. In another alternative design, the number of coil layers wound in each winding area may be greater than or less than three. In brief, the number of coil sections of a coil winding, the number of turns in a winding area and the number of turns of a coil layer may be determined according actual design requirements.

In this embodiment, the common mode inductor apparatus 300 may further include a separating plate 320 to enhance noise suppression ability. The separating plate 320 may divide the magnetic core 304 into the winding zone WR1 and the winding zone WR2, wherein the winding zone WR1 and the winding zone WR2 are located on different sides of the separating plate 302. By way of example but not limitation, the separating plate 302 may be implemented using a circuit board or a printed circuit board. It is also feasible to utilize a plate capable of providing a separating/isolating function to implement the separating plate 302.

Additionally, the common mode inductor apparatus 300 may use epoxy 330 to attach the separating plate 302 to the magnetic core 304. In some embodiments, epoxy 330 may be replaced with other adhesives (e.g. thermosetting polymers).

Figure 4:
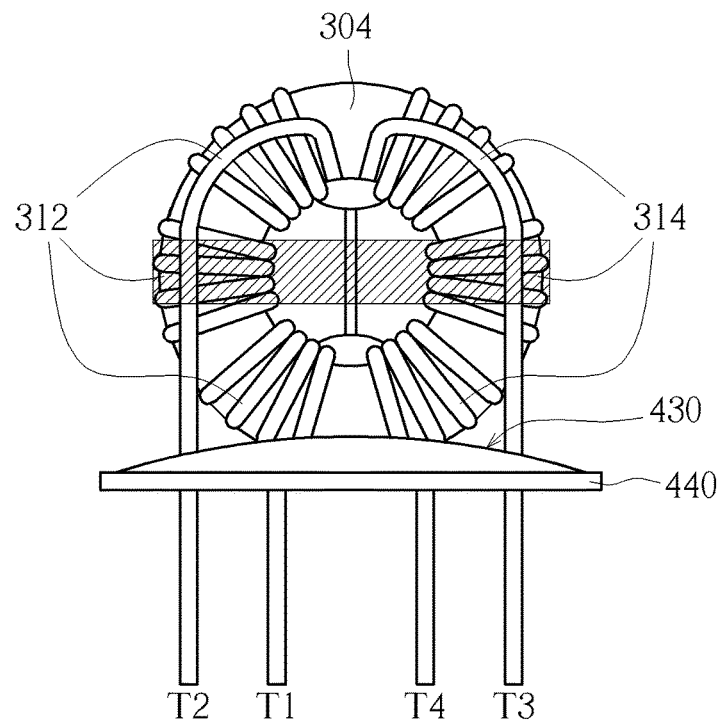
FIG. 4 illustrates exemplary structure of the common mode inductor apparatus shown in FIG. 3A which has been completely wound.
Figure 5:
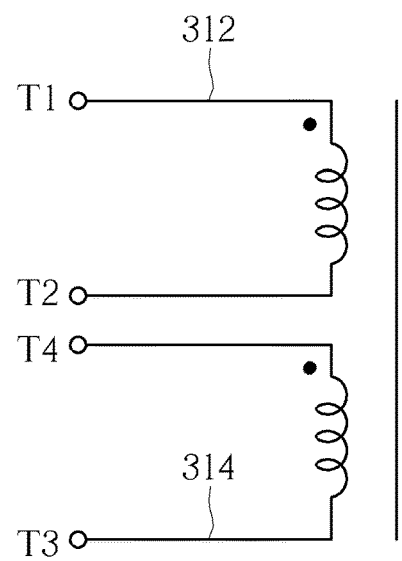
FIG. 5 illustrates an equivalent circuit of the structure shown in FIG. 4.

FIG. 4 illustrates exemplary structure of the common mode inductor apparatus 300 shown in FIG. 3A which has been completely wound. The magnetic core 304 may be attached to a base 440 by epoxy 430 (or other adhesives). Two terminals T1 and T2 of the coil winding 312 may be extended outwards from the magnetic core 304 so as to be coupled to circuit device(s) or electrical signal(s), and two terminals T3 and T4 of the coil winding 314 may be extended outwards from the magnetic core 304 so as to be coupled to circuit device(s) or electrical signal(s), wherein an equivalent circuit of the structure shown in FIG. 4 may be illustrated in FIG. 5. After the terminals T1-T4 are coupled to corresponding circuit device(s) or electrical signal(s), the common mode inductor apparatus 300 may be employed in various circuit structures.

The above structure of the common mode inductor apparatus is for illustrative purposes only, and is not intended to limit the scope of the present invention. In an alternative design, the magnetic core 304 shown in FIG. 3A/FIG. 4 may be implemented using a closed magnetic core or an open magnetic core. In another alternative design where the magnetic core 304 is implemented using a closed magnetic core, the closed magnetic core may be a circular magnetic core, an oval magnetic core, a rectangular magnetic core, an EE magnetic core or a magnetic core having other shapes. In brief, as long as each coil winding is wound in different winding areas within a corresponding winding area of a magnetic core to form a common mode inductor structure, various modifications and alternatives fall within the scope of the present invention.

Figure 6:
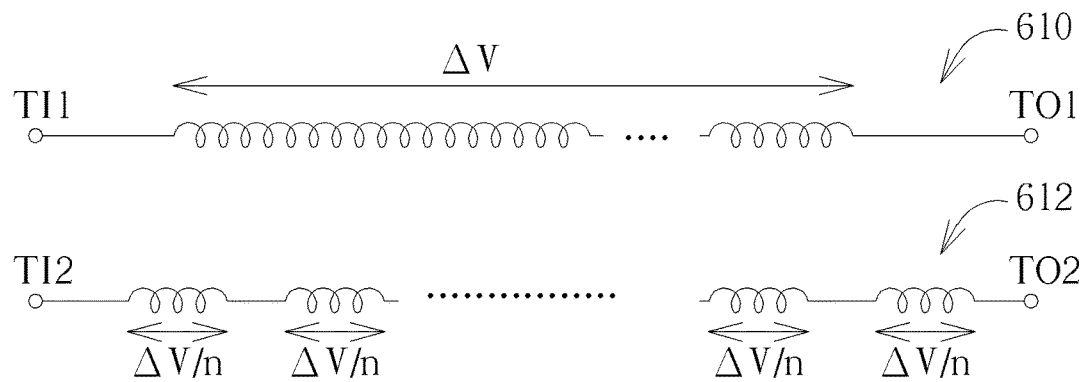
FIG. 6 is a diagram illustrating a coil winding divided into a plurality of coil sections in an exemplary common mode inductor apparatus according to an embodiment of the present invention.

It should be noted that, in order to enhance ability of differential mode filtering, a conventional common mode inductor will increase the number of turns of a coil winding. However, a total voltage drop across the coil winding will increase accordingly, which results in increased parasitic capacitance and affects high-frequency filtering ability. In contrast, the proposed common mode inductor apparatus may not change the number of turns of a coil winding, thereby reducing parasitic capacitance and providing good high-frequency filtering ability. Please refer to FIG. 6, which is a diagram illustrating a coil winding divided into a plurality of coil sections in an exemplary common mode inductor apparatus according to an embodiment of the present invention. Compared with the conventional coil winding 610, the proposed coil winding 612 may have n coil sections (n is greater than three), which may be wound in n winding areas of a magnetic core (not shown in FIG. 6) respectively. In a case where each of a voltage drop between two terminals TI1 and TO1 of the coil winding 610 and a voltage drop between two terminals TI2 and TO2 of the coil winding 612 is equal to $\Delta V$ (e.g. each of the coil winding 610 and the coil winding 612 has the same number of turns), as a voltage drop across each coil section of the coil winding 612 is less than $\Delta V$, the coil winding 612 may have less parasitic capacitance and better high-frequency filtering ability. For example, each coil section of the coil winding 612 may have the same number of turns, wherein a voltage drop across said each coil section may be represented by $\Delta V/n$.

In view of the above, the proposed common mode inductor apparatus may effectively reduce parasitic capacitance and provide good high-frequency filtering ability without changing the number of turns of a winding coil (i.e. without adjusting an amount of common/differential mode inductance). Hence, when the proposed common mode inductor apparatus is employed in an electromagnetic interference (EMI) filter circuit, the EMI filter circuit may have a simple design, thereby reducing space occupied by the EMI filter circuit and saving manufacturing costs.

Figure 7:
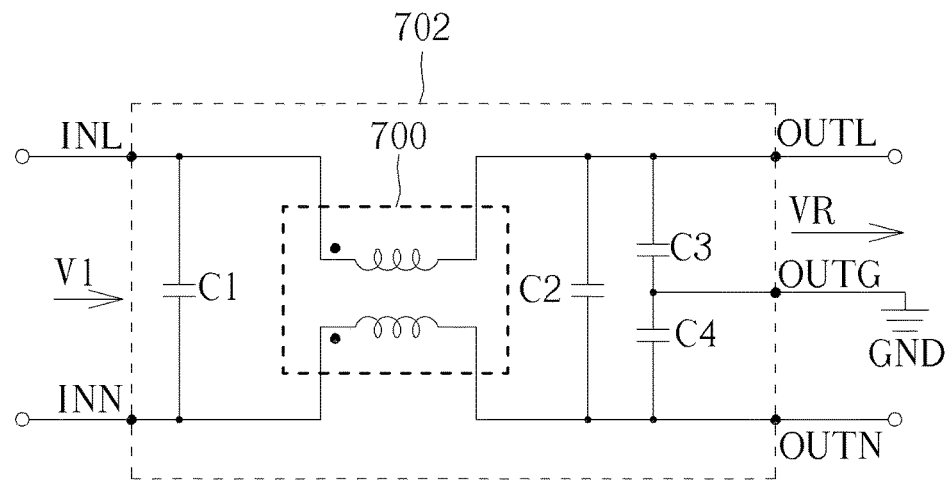
FIG. 7 is a diagram illustrating an exemplary EMI filter circuit according to an embodiment of the present invention.

Please refer to FIG. 7, which is a diagram illustrating an exemplary EMI filter circuit according to an embodiment of the present invention. The EMI filter circuit 702 may receive an input power VI to generate a power to be rectified VR. The EMI filter circuit 702 may include, but is not limited to, a pair of input terminals (having an input terminal INL and an input terminal INN), a pair of output terminals (having an output terminal OUTL and an output terminal OUTN), a ground terminal OUTG, wherein the pair of input terminals is arranged for receiving the input power VI, the pair of output terminals is arranged for outputting the power to be rectified VR, and the ground terminal OUTG is coupled to ground GND.

The EMI filter circuit 702 may further include, but is not limited to, a plurality of capacitors C1-C4 and a common mode inductor apparatus 700, wherein the capacitor C1 is coupled between the input terminal INL and the input terminal INN (e.g. an X capacitor), the capacitor C2 is coupled between the output terminal OUTL and the output terminal OUTN (e.g. an X capacitor), the capacitor C3 is coupled between the output terminal OUTL and the ground terminal OUTG (e.g. a Y capacitor), and the capacitor C4 is coupled between the ground terminal OUTG and the output terminal OUTN the (e.g. a Y capacitor). The common mode inductor apparatus 700 may be implemented by the common mode inductor apparatus 300 shown in FIG. 3A/FIG. 4, and is shown as an equivalent circuit for illustrative purposes. Compared with the conventional common mode inductor apparatus which enhances filtering ability by increasing inductance, the common mode inductor apparatus 700 may use a small amount of inductance to achieve EMI suppression ability comparable/identical to that of the conventional common mode inductor. Hence, the common mode inductor apparatus 700 may employ a single-stage structure to provide good EMI suppression ability, wherein an amount of inductance of the common mode inductor apparatus 700 may be only a fraction of that of the conventional common mode inductor (i.e. one half).

Figure 8:
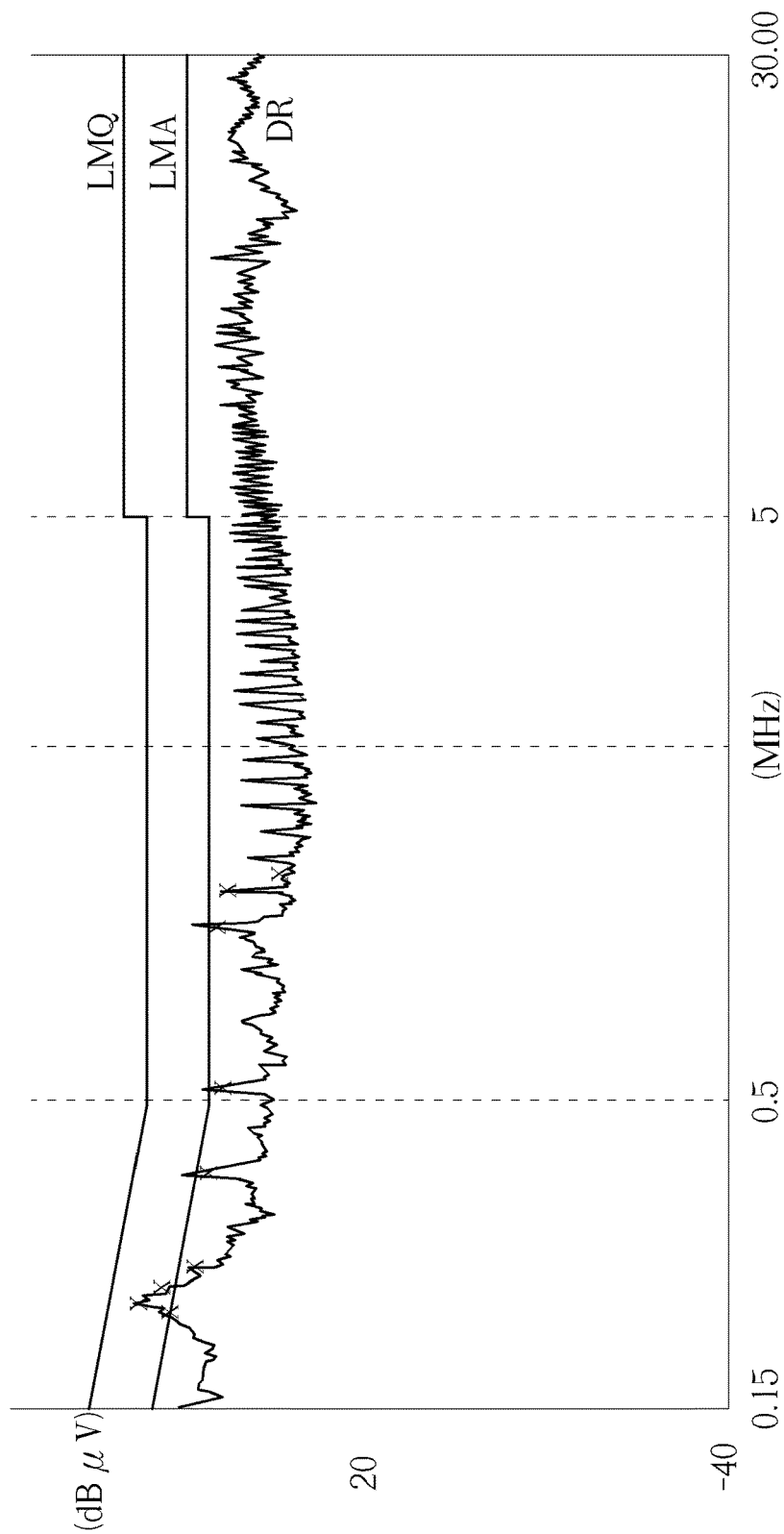
FIG. 8 is a diagram illustrating a conducted emission test result of the EMI filter circuit shown in FIG. 7 according to an embodiment of the present invention.

FIG. 8 is a diagram illustrating a conducted emission test result of the EMI filter circuit 702 shown in FIG. 7 according to an embodiment of the present invention. As shown in FIG. 8, quasi-peaks of the conducted EMI susceptibility test result DR (in units of dBPV) are lower than CISPR22 Class B quasi-peak limits LMQ, and averages of the conducted EMI susceptibility test result DR (in units of dBPV) are lower than CISPR22 Class B average limits LMA. In view of this, the EMI filter circuit 702 shown in FIG. 7 possesses a good filtering ability in high frequency bands (in units of MHz).

It should be noted that the circuit topology shown in FIG. 7 is for illustrative purposes only, and is not meant to be a limitation of the present invention. For example, the common mode inductor apparatus 700 may be implemented by a common mode inductor apparatus including a coil winding divided into four or more coil sections. In another example, the capacitor C1 coupled between the input terminal INL and the input terminal INN may be replaced with a plurality of Y capacitors.

Figure 9:
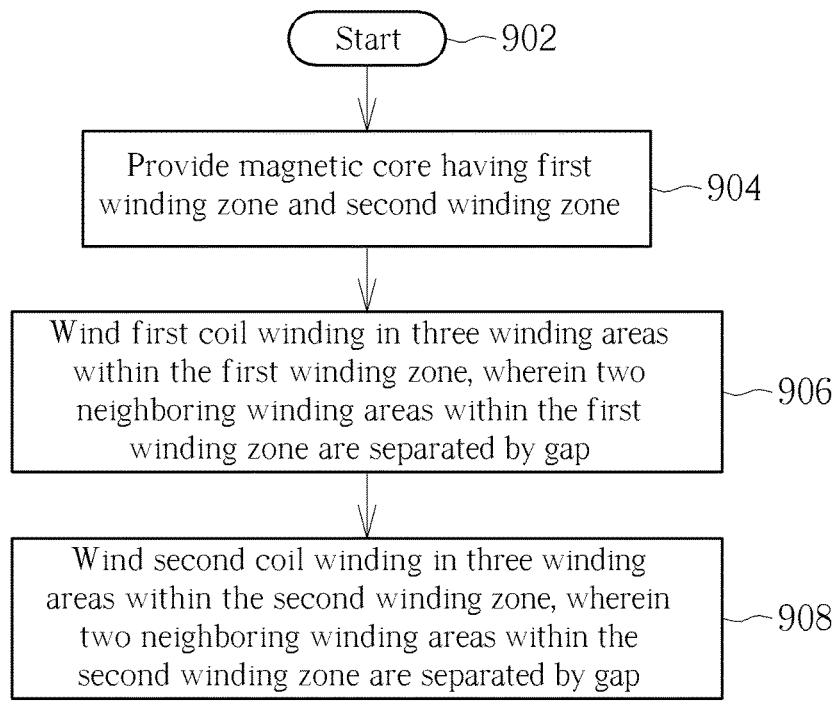
FIG. 9 is a flow chart of an exemplary method for winding a first coil winding and a second coil winding of a common mode inductor apparatus according to an embodiment of the present invention.

An exemplary winding method of the proposed common mode inductor apparatus may be summarized in FIG. 9. FIG. 9 is a flow chart of an exemplary method for winding a first coil winding and a second coil winding of a common mode inductor apparatus according to an embodiment of the present invention. Please note that if the result is substantially the same, steps are not required to be executed in the exact order shown in FIG. 9. In addition, for illustrative purposes, the method shown in FIG. 9 is described with reference to the common mode inductor apparatus 300 shown in FIG. 3A. However, this is not intended to limit the scope of the present invention. The method shown in FIG. 9 may be summarized below.

Step 902: Start.

Step 904: Provide a magnetic core having a first winding zone and a second winding zone, such as the winding zone WR1 and the winding zone WR2.

Step 906: Wind the first coil winding in three winding areas within the first winding zone, wherein two neighboring winding areas within the first winding zone are separated by a gap. For example, the coil winding 312 may be wound in the three winding areas A11-A13 within the winding zone WR1, wherein the winding area A11 and the winding area A12 are separated by the gap G11, and the winding area A12 and the winding area A13 are separated by the gap G12.

Step 908: Wind the second coil winding in three winding areas within the second winding zone, wherein two neighboring winding areas within the second winding zone are separated by a gap. For example, the coil winding 314 may be wound in the three winding areas A21-A23 within the winding zone WR2, wherein the winding area A21 and the winding area A22 are separated by the gap G21, and the winding area A22 and the winding area A23 are separated by the gap G22.

Figure 10:
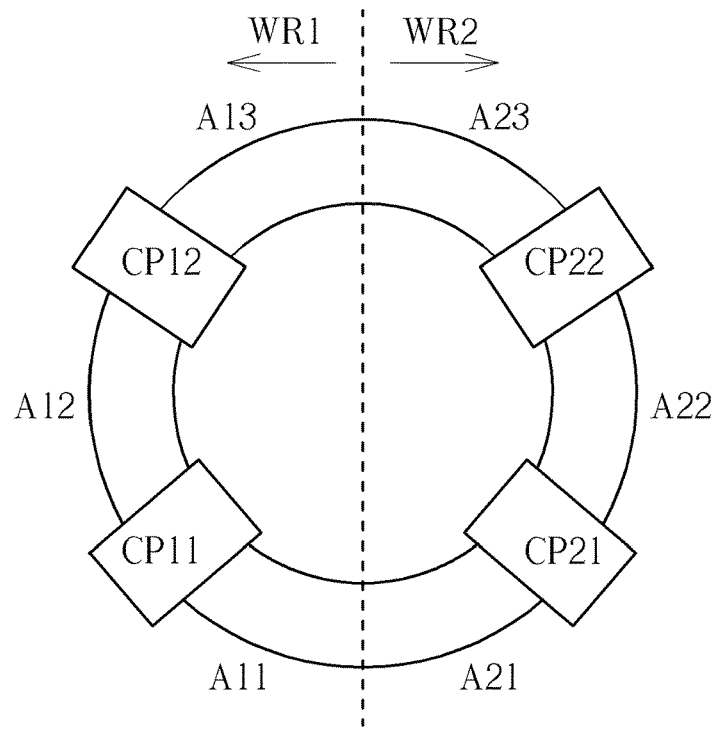
FIG. 10 is a diagram illustrating exemplary clamp devices clamping at the magnetic core shown in FIG. 3A according to an embodiment of the present invention.

In step 906 and/or step 908, the method may have a plurality of clamp devices clamp at a winding zone so as to define three winding areas within the winding zone. Please refer to FIG. 10, which is a diagram illustrating exemplary clamp devices clamping at the magnetic core 304 shown in FIG. 3A according to an embodiment of the present invention. In this embodiment, the clamp devices CP11 and CP12 may clamp at the winding zone WR1 to define the three winding areas A11-A13 within the winding zone WR1, wherein two neighboring winding areas of the three winding areas A11-A13 are separated by a clamp device. Similarly, the clamp devices CP21 and CP22 may clamp at the winding zone WR2 to define the three winding areas A21-A23 within the winding zone WR2, wherein two neighboring winding areas of the three winding areas A21-A23 are separated by a clamp device.

In other words, in step 906 shown in FIG. 9, the method may have a plurality of clamp devices clamp at the first winding zone so as to define the three winding areas within the first winding zone, wherein two neighboring winding areas of the three winding areas within the first winding zone are separated by a clamp device. As one skilled in the art should understand operation of each step shown in FIG. 9 after reading the above paragraphs directed to FIGS. 1-8, further description is omitted here for brevity.

To sum up, the proposed common mode inductor apparatus, the proposed winding method of a common mode inductor apparatus and the proposed EMI filter circuit may enhance EMI suppression ability of a common mode inductor, and reduce space occupied by the EMI filter circuit, thereby meeting miniaturization and high-frequency operation requirements of a power supply.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A common mode inductor apparatus, comprising:
   a magnetic core, having a first winding zone and a second winding zone;
   a first coil winding, wound in three winding areas within the first winding zone, wherein two neighboring winding areas within the first winding zone are separated by a gap having no windings, and a number of turns in each of the three winding areas is the same; and
   a second coil winding, wound in three winding areas within the second winding zone, wherein two neighboring winding areas within the second winding zone are separated by a gap having no windings;
   wherein the magnetic core is symmetric with respect to an axis and the first winding zone and the second winding zone located on different sides of the axis;
   wherein the first coil winding and the second coil winding are axisymmetric about the axis.

2. The common mode inductor apparatus of claim 1, wherein the second coil winding is wound symmetrically in relation to the first coil winding in the second winding zone.

3. The common mode inductor apparatus of claim 2, wherein a number of turns of the first coil winding is equal to a number of turns of the second coil winding.

4. The common mode inductor apparatus of claim 1, wherein the magnetic core is a closed magnetic core or an open magnetic core.

5. The common mode inductor apparatus of claim 4, wherein the closed magnetic core is a circular magnetic core, an oval magnetic core or a rectangular magnetic core.

6. The common mode inductor apparatus of claim 1, further comprising:
   a separating plate, aligned with the axis and for dividing the magnetic core into the first winding zone and the second winding zone.

7. The common mode inductor apparatus of claim 6, wherein the separating plate is a circuit board.

8. A method for winding a first coil winding and a second coil winding of a common mode inductor apparatus, comprising:
   providing a magnetic core having a first winding zone and a second winding zone;
   winding the first coil winding in three winding areas within the first winding zone, wherein two neighboring winding areas within the first winding zone are separated by a gap having no windings, and a number of turns in each of the three winding areas is the same; and
   winding the second coil winding in three winding areas within the second winding zone, wherein two neighboring winding areas within the second winding zone are separated by a gap having no windings;
   wherein the magnetic core is symmetric with respect to an axis and the first winding zone and the second winding zone located on different sides of the axis;
   wherein the first coil winding and the second coil winding are axisymmetric about the axis.

9. The method of claim 8, wherein the step of winding the second coil winding in the three winding areas within the second winding zone comprises:
   in the three winding areas within the second winding zone being symmetrical to the three winding areas within the first winding zone, winding the second coil winding.

10. The method of claim 9, wherein a number of turns of the first coil winding is equal to a number of turns of the second coil winding.

11. The method of claim 8, wherein the magnetic core is a closed magnetic core or an open magnetic core.

12. The method of claim 11, wherein the closed magnetic core is a circular magnetic core, an oval magnetic core or a rectangular magnetic core.

13. The method of claim 8, wherein the step of winding the first coil winding in the three winding areas within the first winding zone comprises:
   having a plurality of clamp devices clamped at the first winding zone so as to define the three winding areas within the first winding zone, wherein two neighboring winding areas of the three winding areas within the first winding zone are separated by a corresponding one of the plurality of clamp devices.

14. The method of claim 8, wherein the step of providing the magnetic core having the first winding zone and the second winding zone comprises:
   utilizing a separating plate aligned with the axis to divide the magnetic core into the first winding zone and the second winding zone.

15. The method of claim 14, wherein the separating plate is a circuit board.

16. An electromagnetic interference filter circuit, the electromagnetic interference filter circuit receiving an input power to generate a power to be rectified, the electromagnetic interference filter circuit comprising:
   a pair of input terminals, having a first input terminal and a second input terminal, the pair of input terminals arranged for receiving the input power;
   a pair of output terminals, having a first output terminal and a second output terminal, the pair of output terminals arranged for outputting the power to be rectified;
   a ground terminal;
   a first capacitor, coupled between the first input terminal and the second input terminal;
   a second capacitor, coupled to the first output terminal and the second output terminal;
   a third capacitor, coupled between the first output terminal and the ground terminal;
   a fourth capacitor, coupled between the ground terminal and the second output terminal; and
   a common mode inductor apparatus, coupled to the pair of input terminals and the pair of output terminals, the common mode inductor apparatus comprising:
      a magnetic core, having a first winding zone and a second winding zone;
      a first coil winding, coupled between the first input terminal and the first output terminal, wherein the first coil winding is wound in three winding areas within the first winding zone, and two neighboring winding areas within the first winding zone are separated by a gap having no windings, and a number of turns in each of the three winding areas is the same; and
      a second coil winding, coupled between the second input terminal and the second output terminal, wherein the second coil winding is wound in three winding areas within the second winding zone, and two neighboring winding areas within the second winding zone are separated by a gap having no windings;
   wherein the magnetic core is symmetric with respect to an axis and the first winding zone and the second winding zone located on different sides of the axis;
   wherein the first coil winding and the second coil winding are axisymmetric about the axis.

* * * * *